(12) United States Patent
Cruz

(10) Patent No.: US 9,378,522 B2
(45) Date of Patent: Jun. 28, 2016

(54) METHODS AND SYSTEMS FOR THE NONINTRUSIVE IDENTIFICATION AND ORDERING OF COMPONENT PARTS

(71) Applicant: W.W. GRAINGER, INC., Lake Forest, IL (US)

(72) Inventor: Erwin Munoz Cruz, Hoffman Estates, IL (US)

(73) Assignee: W.W. GRAINGER, INC., Lake Forest, IL (US)

( * ) Notice: Subject to any disclaimer, the term of this patent is extended or adjusted under 35 U.S.C. 154(b) by 3 days.

(21) Appl. No.: 13/777,793

(22) Filed: Feb. 26, 2013

(65) Prior Publication Data

US 2014/0244433 A1    Aug. 28, 2014

(51) Int. Cl.
  *G06Q 30/00*   (2012.01)
  *G06Q 30/06*   (2012.01)
  *G06T 7/00*    (2006.01)
  *G06T 19/20*   (2011.01)
  *G06K 9/46*    (2006.01)
  *G06F 17/50*   (2006.01)
  *G06K 9/00*    (2006.01)

(52) U.S. Cl.
  CPC ........ *G06Q 30/0633* (2013.01); *G06F 17/5086* (2013.01); *G06K 9/00201* (2013.01); *G06K 9/46* (2013.01); *G06T 7/001* (2013.01); *G06T 19/20* (2013.01); *G06T 2200/04* (2013.01); *G06T 2207/10116* (2013.01); *G06T 2207/30164* (2013.01); *G06T 2219/016* (2013.01); *G06T 2219/2008* (2013.01); *G06T 2219/2012* (2013.01)

(58) Field of Classification Search
  CPC ................ G06Q 30/06–30/0645; G06Q 30/08
  USPC .................................................. 705/26.1–27.2
  See application file for complete search history.

(56) References Cited

U.S. PATENT DOCUMENTS

| | | | |
|---|---|---|---|
| 8,363,781 B2 | 1/2013 | Kato et al. | |
| 2004/0148188 A1* | 7/2004 | Uegaki | 705/1 |
| 2008/0267487 A1* | 10/2008 | Siri | G06Q 10/087 382/141 |
| 2012/0221438 A1* | 8/2012 | Cook et al. | 705/26.61 |
| 2012/0230548 A1* | 9/2012 | Calman et al. | 382/104 |
| 2012/0265651 A1* | 10/2012 | Ephraim | 705/27.2 |
| 2013/0173466 A1* | 7/2013 | Lepisto et al. | 705/44 |
| 2013/0261876 A1* | 10/2013 | Froom | B64F 5/0045 701/29.3 |
| 2013/0294560 A1* | 11/2013 | Graham | 376/216 |

FOREIGN PATENT DOCUMENTS

WO    WO 2012050803 A2 *  4/2012    ............ B64F 5/0045

OTHER PUBLICATIONS

Pierorazio, A. J. (1996). Design construction, and commissioning of a facility for the dynamic testing of pressure relief valves (Order No. MM15184). Available from ProQuest Dissertations & Theses Global. (304324108). Retrieved from http://search.proquest.com/docview/304324108?accountid=14753.*

* cited by examiner

*Primary Examiner* — Resha Desai
*Assistant Examiner* — Alex Wolcott
(74) *Attorney, Agent, or Firm* — Greenberg Traurig, LLP

(57) ABSTRACT

A noninstrusive system and method of scanning an object having component parts includes a vendor based data repository of component parts and a matching processor to receive a scanned image representative of the assembled object and to provide suggested and/or matched component parts for purchase from the vendor.

3 Claims, 7 Drawing Sheets

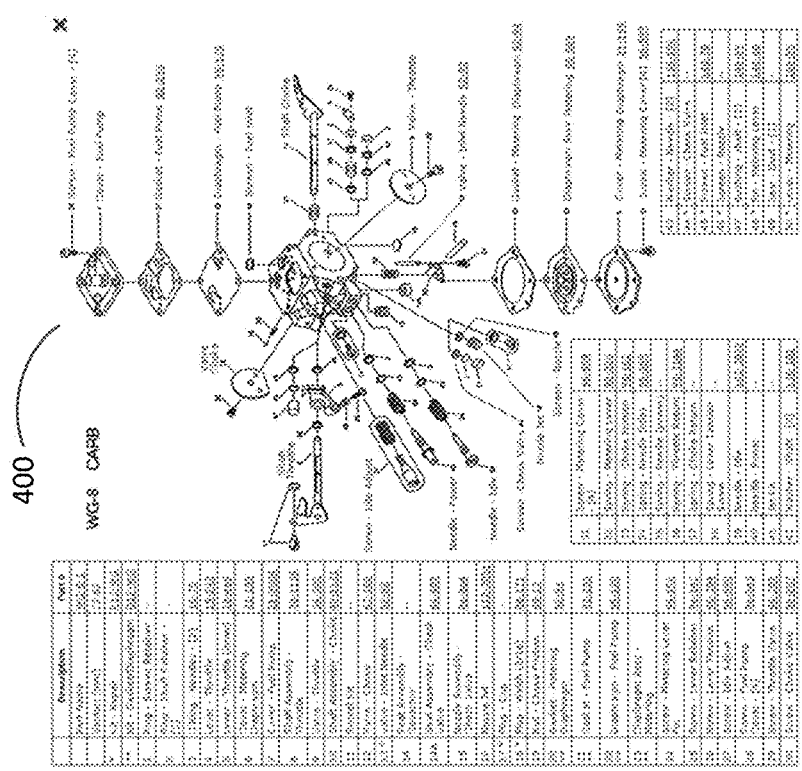
FIG. 4
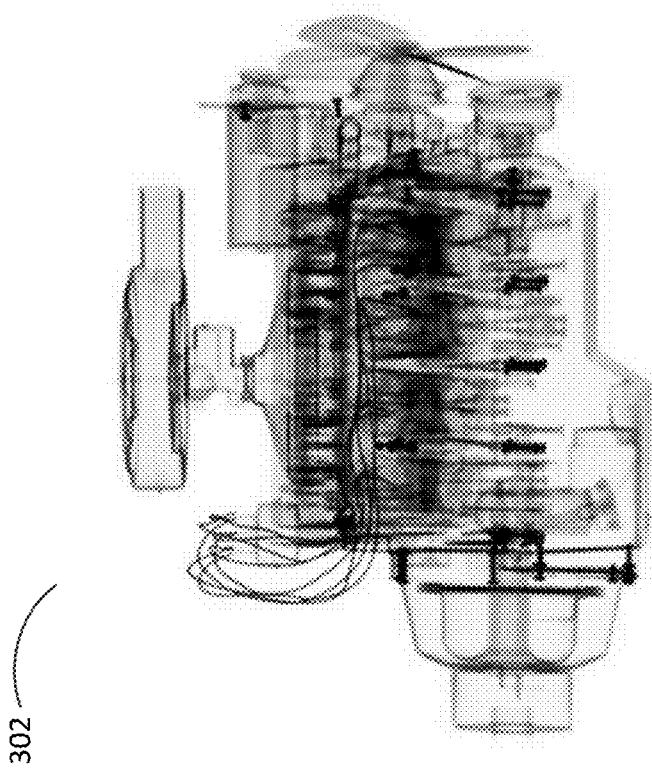

METHODS AND SYSTEMS FOR THE NONINTRUSIVE IDENTIFICATION AND ORDERING OF COMPONENT PARTS

FIELD OF THE DISCLOSURE

The present description relates generally to procurement of replacement and/or maintenance parts, and more particularly to methods and systems for the nonintrusive identification and ordering of component parts.

BACKGROUND OF RELATED ART

Today's machines and devices are oftentimes more complex, more cluttered, and more difficult to effect repairs than previous devices. For instance, in one example, today's manufacturing processes take advantage of modularized and component based manufacturing techniques, making the process of diagnosing and effecting repairs difficult. As is often the case, when a user wishes to diagnose a potential problem, or effect a repair, the user must deconstruct the device, embarking on an intricate, time consuming, and in some instances, destructive venture.

Still further, once a device is taken apart, the user must be able to identify the component part of concern and then manually utilize a parts list, repair manual, etc., to correctly identify and order the part for replacement. This process can be time consuming and fraught with errors as the manual identification of the part and/or the ordering of the proper repair part can lead to human mistakes.

While the present manual methods may be sufficient for most purposes, there is an identifiable need for various methods and systems for providing an automated, nonintrusive identification and ordering of parts.

BRIEF DESCRIPTION OF THE DRAWINGS

For a better understanding of the present disclosure, reference may be had to various examples shown in the attached drawings.

FIG. 4 illustrates an example scanned object produced by the example nonintrusive methods and systems disclosed.

DETAILED DESCRIPTION

The following description of example methods and apparatus is not intended to limit the scope of the description to the precise form or forms detailed herein. Instead the following description is intended to be illustrative so that others may follow its teachings.

X-ray, γ-ray, and other scanning technologies have continued to evolve allowing advancements in nonintrusive identification methods. For instance, in one example, U.S. Pat. No. 8,363,781, hereby incorporated by reference in its entirety, describes a nondestructive identification device that includes a radiation source and an image processing device to scan and recognize a material of a sample without opening and/or destroying the object to be inspected. Other scanning technologies may allow for additional scanning details, including scanning of simple or complicated mechanical objects having component parts forming the object.

The present disclosure leverages the latest scanning technologies, such as the technologies described above, to develop high definition part recognition systems and methods such as three-dimensional image recognition and three-dimensional projection imaging. Specifically, the present disclosure provides for systems and methods to allow a user the ability to conveniently scan an object, and to provide a component image with a detailed look at the scanned object with manually and/or automatically identifiable and matching components (e.g. parts) of the object being illustrated. The scanned object and the identified parts may then be cross-referenced against a parts database for recommendations and/or automated part ordering. Once confirmed against the database, a dynamic parts list may be displayed to the user to allow the user to select the individual part(s) of interest. In some examples, the scanning process is utilized to automatically detect "broken" components of the finished object by alerting the user via various alerts (e.g., highlighting, pop-ups, text messages, etc.). The identification (either manual or automatically) allows access to a variety of procurement sources for ordering replacement parts, replacement objects, technician services, repair instructions, repair videos, obtaining expert advice, click-to-chat, live support, and/or the like. In other words, the described system allows a user to identify and order the components of the object in question without having to take apart and/or otherwise destruct the original object.

Figure 1:
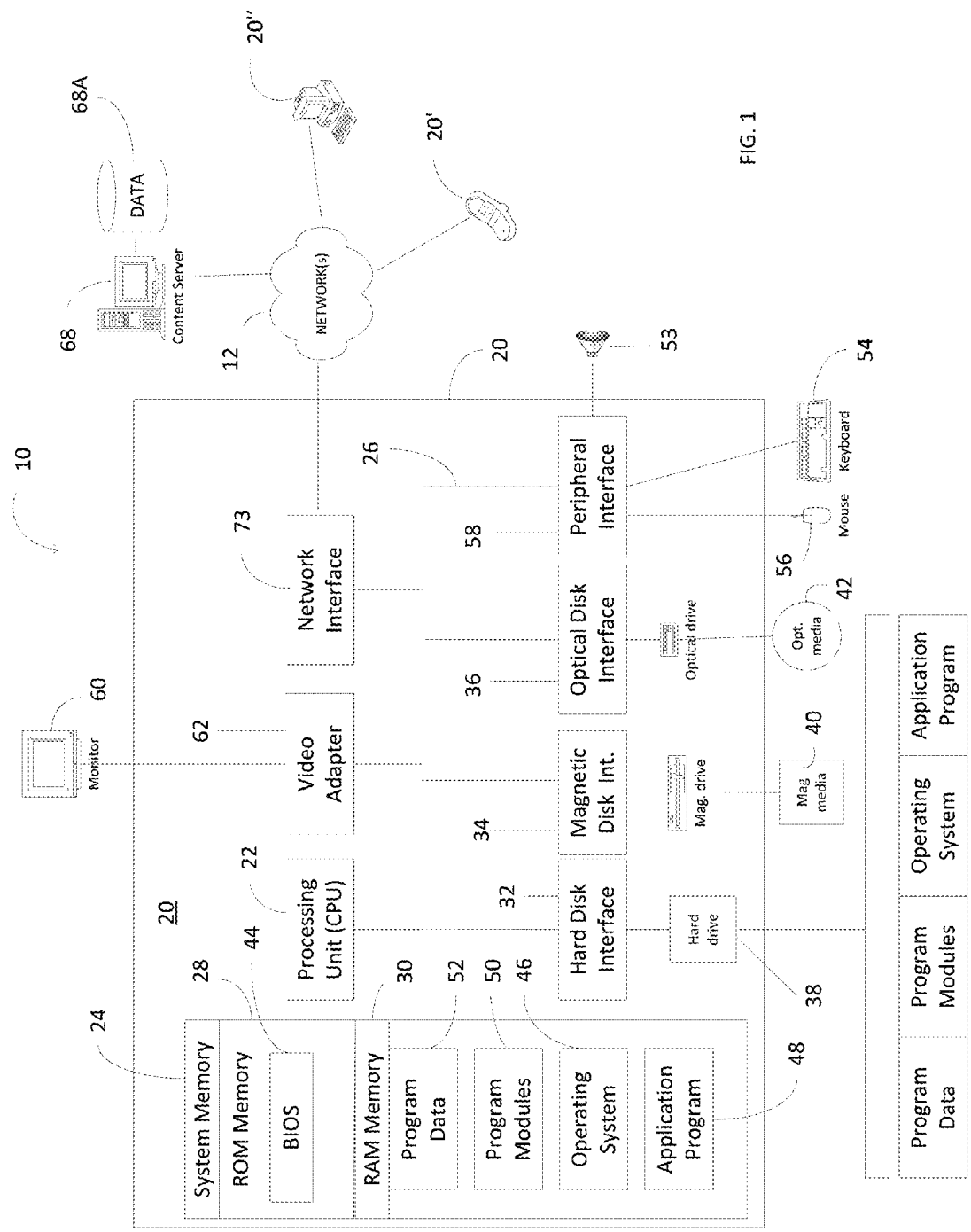
FIG. 1 illustrates in block diagram form components of an example, computer network environment suitable for implementing the example nonintrusive identification methods and systems disclosed.

With reference to the figures, and more particularly, with reference to FIG. 1, the following discloses an example system 10 as well as other example systems and methods for providing nonintrusive identification and ordering of parts on a networked and/or stand alone computer, such as a personal computer or mobile device. To this end, a processing device 20", illustrated in the exemplary form of a mobile communication device, a processing device 20', illustrated in the exemplary form of a computer system, and a processing device 20 illustrated in schematic form, are provided with executable instructions to, for example, provide a means for a customer, e.g., a user, client, corporate shopper, buyer, consumer, service technician, etc., to access a host system server 68 and, among other things, be connected to a hosted vendor purchasing system, e.g., a website, mobile application, etc. Generally, the computer executable instructions reside in program modules which may include routines, programs, objects, components, data structures, etc. that perform particular tasks or implement particular abstract data types. Accordingly, those of ordinary skill in the art will appreciate that the processing devices 20, 20', 20" illustrated in FIG. 1 may be embodied in any device having the ability to execute instructions such as, by way of example, a personal computer, a mainframe computer, a personal-digital assistant ("PDA"), a cellular telephone, a mobile device, a tablet, an ereader, or the like. Furthermore, while described and illustrated in the context of a single processing device 20, 20', 20" those of ordinary skill in the art will also appreciate that the various tasks described hereinafter may be practiced in a distributed environment having multiple processing devices linked via a local or wide-area network whereby the executable instructions may be associated with and/or executed by one or more of multiple processing devices.

For performing the various tasks in accordance with the executable instructions, the example processing device 20 includes a processing unit 22 and a system memory 24 which may be linked via a bus 26. Without limitation, the bus 26 may be a memory bus, a peripheral bus, and/or a local bus using any of a variety of bus architectures. As needed for any particular purpose, the system memory 24 may include read only memory (ROM) 28 and/or random access memory (RAM) 30. Additional memory devices may also be made accessible to the processing device 20 by means of, for example, a hard disk drive interface 32, a magnetic disk drive interface 34, and/or an optical disk drive interface 36. As will be understood, these devices, which would be linked to the system bus 26, respectively allow for reading from and writing to a hard disk 38, reading from or writing to a removable magnetic disk 40, and for reading from or writing to a removable optical disk 42, such as a CD/DVD ROM or other optical media. The drive interfaces and their associated computer-readable media allow for the nonvolatile storage of computer-readable instructions, data structures, program modules, and other data for the processing device 20. Those of ordinary skill in the art will further appreciate that other types of non-transitory computer-readable media that can store data and/or instructions may be used for this same purpose. Examples of such media devices include, but are not limited to, magnetic cassettes, flash memory cards, digital videodisks, Bernoulli cartridges, random access memories, nano-drives, memory sticks, cloud based storage devices, and other read/write and/or read-only memories.

A number of program modules may be stored in one or more of the memory/media devices. For example, a basic input/output system (BIOS) 44, containing the basic routines that help to transfer information between elements within the processing device 20, such as during start-up, may be stored in ROM 28. Similarly, the RAM 30, hard drive 38, and/or peripheral memory devices may be used to store computer executable instructions comprising an operating system 46, one or more applications programs 48 (such as a Web browser, mobile application, etc.), other program modules 50, and/or program data 52. Still further, computer-executable instructions may be downloaded to one or more of the computing devices as needed, for example via a network connection.

To allow a user to enter commands and information into the processing device 20, input devices such as a keyboard 54 and/or a pointing device 56 are provided. While not illustrated, other input devices may include a microphone, a joystick, a game pad, a scanner, a camera, touchpad, touch screen, motion sensor, etc. These and other input devices would typically be connected to the processing unit 22 by means of an interface 58 which, in turn, would be coupled to the bus 26. Input devices may be connected to the processor 22 using interfaces such as, for example, a parallel port, game port, firewire, a universal serial bus (USB), etc. To view information from the processing device 20, a monitor 60 or other type of display device may also be connected to the bus 26 via an interface, such as a video adapter 62. In addition to the monitor 60, the processing device 20 may also include other peripheral output devices, such as, for example, speakers 53, cameras, printers, or other suitable device.

As noted, the processing device 20 may also utilize logical connections to one or more remote processing devices, such as the host system server 68 having associated data repository 68A. The example data repository 68A may include any suitable vendor data including, for example, customer/company information, electronic catalog pages, vendor, parts listings, service manuals, etc. In this example, the data repository 68A includes a listing of a plurality of products that are available for purchase. Each of the products may be separately available for purchase, and may be associated with a larger product assembly. For instance, the part may be a sub-assembly (e.g., an Output Shaft Seal; Part No. 902-122-0411) of one or more associated larger part(s), (e.g., a Gearmotor assembly; Part No. 017-650-9060, etc.).

In this regard, while the host system server 68 has been illustrated in the exemplary form of a computer, it will be appreciated that the host system server 68 may, like processing device 20, be any type of device having processing capabilities. Again, it will be appreciated that the host system server 68 need not be implemented as a single device but may be implemented in a manner such that the tasks performed by the host system server 68 are distributed amongst a plurality of processing devices/databases located at different geographical locations and linked through a communication network. Additionally, the host system server 68 may have logical connections to other third party systems via a network 12, such as, for example, the Internet, LAN, MAN, WAN, cellular network, cloud network, enterprise network, virtual private network, wired and/or wireless network, or other suitable network, and via such connections, will be associated with data repositories that are associated with such other third party systems. Such third party systems may include, without limitation, systems of banking, credit, or other financial institutions, systems of third party providers of goods and/or services, systems of shipping/delivery companies, etc.

For performing tasks as needed, the host system server 68 may include many or all of the elements described above relative to the processing device 20. In addition, the host system server 68 would generally include executable instructions for, among other things, initiating a nondestructive/nonintrusive identification process, receiving part identifications, facilitating the ordering of a vendor product, and, providing access to merchandise purchasing, etc.

Communications between the processing device 20 and the host system server 68 may be exchanged via a further processing device, such as a network router (not shown), that is responsible for network routing. Communications with the network router may be performed via a network interface component 73. Thus, within such a networked environment, e.g., the Internet, World Wide Web, LAN, cloud, or other like type of wired or wireless network, it will be appreciated that program modules depicted relative to the processing device 20, or portions thereof, may be stored in the non-transitory memory storage device(s) of the host system server 68.

Figure 2:
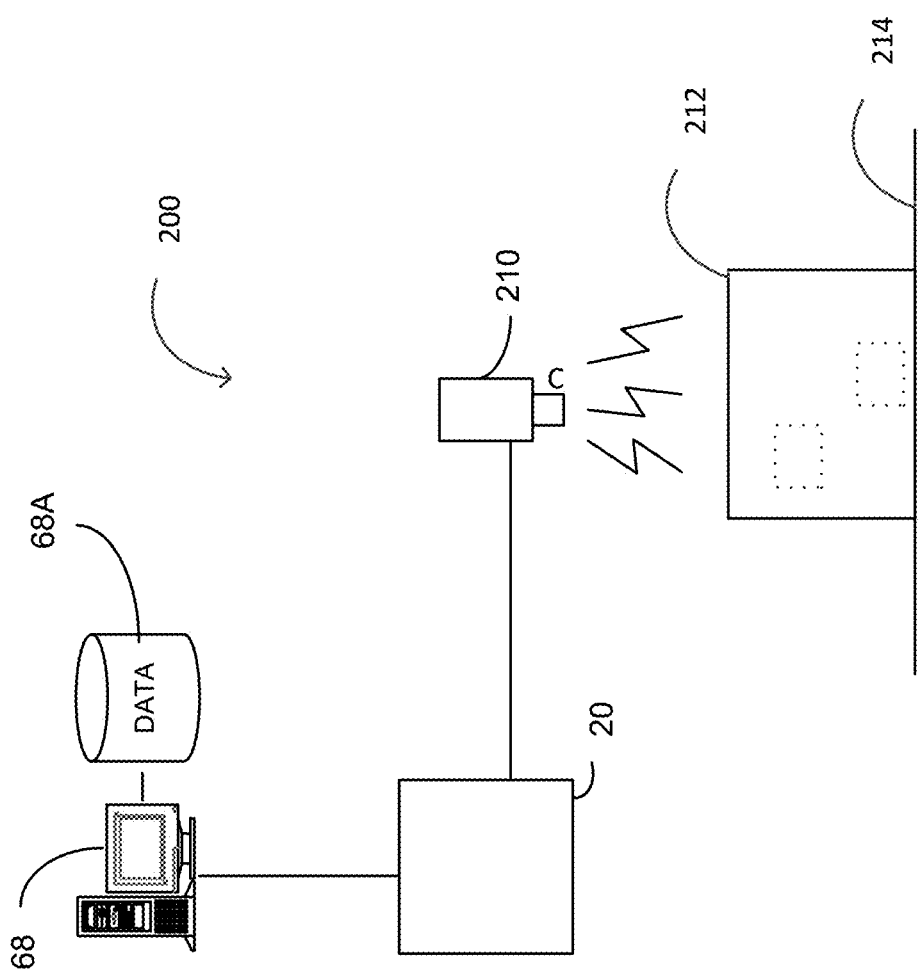
FIG. 2 illustrates an example system level diagram for implementing the example nonintrusive identification methods and systems disclosed.

Turning now to FIG. 2, there is illustrated an example system 200 for facilitating the nonintrusive identification and ordering of component parts. The example system 200 includes a nonintrusive identification device 210 adapted to scan and identify components of a target object 212 supported on, for example, a support surface 214. The identification device 210 is communicatively coupled to a purposed processing device such as the processing device 20. In this example, the identification device 210 may be a nondestructive identification device such as the device described in U.S. Pat. No. 8,363,781, incorporated herein by reference, and/o any other suitable device. Furthermore, the identification device may be a standalone device and/or system such as illustrated in FIG. 2, or may be at least partially integrated into the device 20 (e.g., utilizing a camera input device) as desired.

Specifically, the device 20 may be provided with some or all of the functional components of the device 210 as desired.

Figure 3:
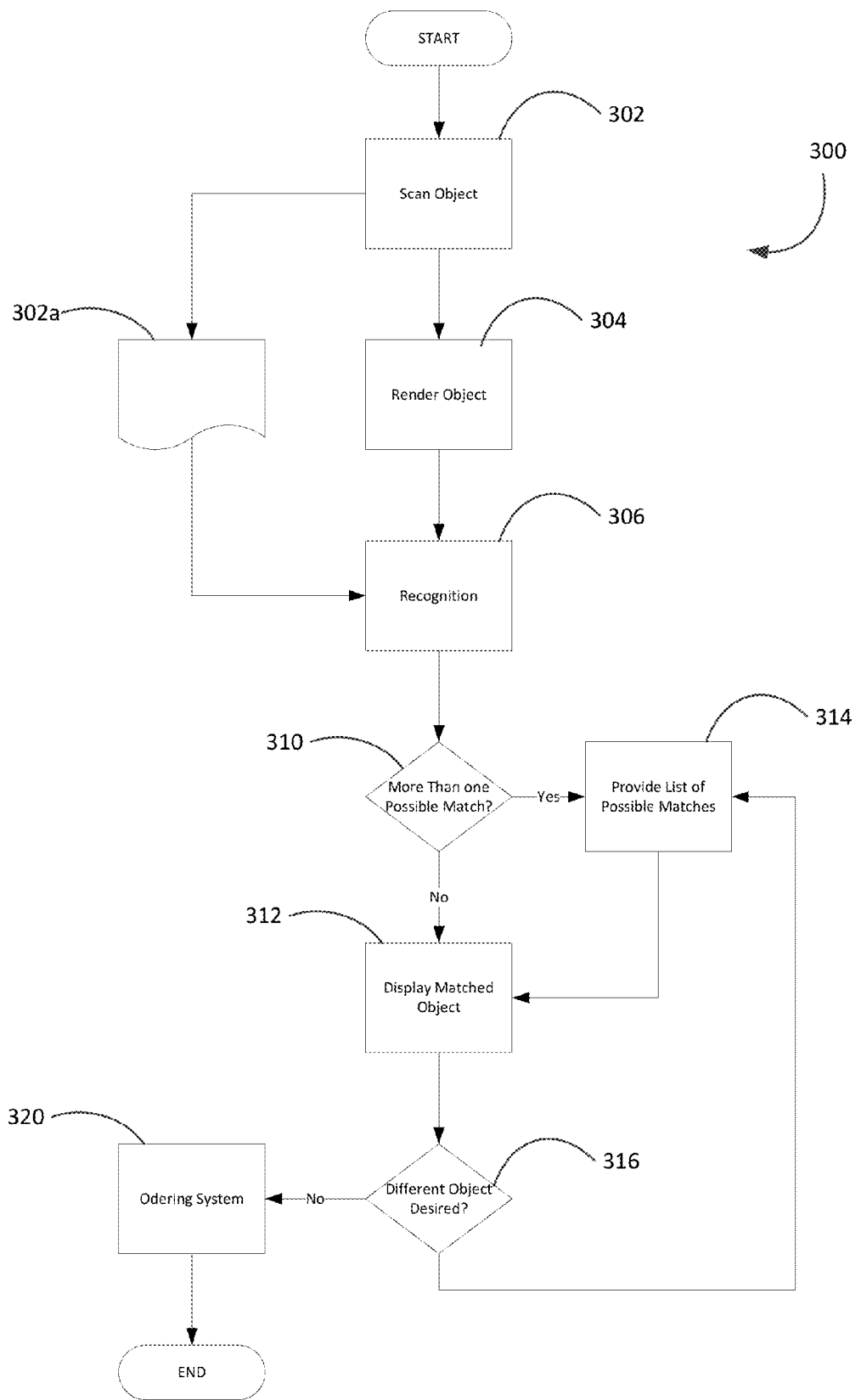
FIG. 3 illustrates an example flow chart illustrating processes that may be performed during implementation of the example nonintrusive methods and systems disclosed.

FIG. 3 describes an example method 300 of providing a nonintrusive identification of component parts and to provide an ability to order the same. In particular, the example method 300 begins at a block 302 where the target object 212 is scanned by the identification device 210 to form a scanned version of the object 302a. It will be understood by one of ordinary skill in the art that the identification device 210 may be sufficiently large so as to require that the target object 212 be brought to the identification device 210 (e.g., the device 210 is stationary), or alternatively, the identification device 210 may be portable, allowing the device 210 to travel to the target object 212.

In the present example, in scanning the target object 212, the process 302 will first determine if the identification device 210 is capable of scanning the entire target object 212 in a single scan, or whether the scan requires multiple positions and/or scans due to size, shape, complexity, etc. Once determined the identification device 210 may take as many scan passes as may be required to provide a full captured image of the components comprising the object 212. It will be appreciated by one of ordinary skill in the art that the detail and degree of accuracy of the scan in the process 302 may vary based upon any number of factors, including size of the object 212, complexity of the object 212, degree of likelihood of a part match, etc. The object 212 may be further scanned with multiple viewpoints, including for example, a multi-angle scan (e.g, 90°, 180°, 360°, etc.), which can provide a more detailed match and provide additional information that may not be readily apparent through a more narrowed scan. It will be further appreciated that the scanning process 302 may provide a variety of other scanning parameters and including, for instance, temperature scans, material differentiation, and/or microscopic imperfections (i.e., breaks, deformities, cracks, or the like).

Once the target object 212 is scanned, process control moves to a block 304, wherein the scanned version of the object 302a is rendered on a display device, such as the monitor 60 or any other suitable rendering device. As example display of the scanned version of the object 302a is illustrated in FIG. 4, along with an assembly view 400 of the part as stored in the data repository 68A. Furthermore, the rendering may, in some circumstances, not be displayed at all, but rather stored in memory, storage, etc., for later recall as desired. In the present example, the object 212 is initially rendered as a high definition outline (e.g., x-ray) image of the object 212. The example rendering may be two dimensional or three dimensional as desired. Additionally, the rendered image may be displayed utilizing any number of different algorithms to highlight and/or identify areas of interest including breaks, component outlines, etc.

After rendering, the scanned version of the object 302a is processed through a recognition algorithm at a block 306. It will be appreciated that the recognition process 306 may be a manual process (e.g. a user must match the rendered component to a parts listing, may be an automated process (e.g., an algorithm matches the component), or may be a combination thereof. In this example, the image recognition algorithm first identifies at least one component of the object 302a to be matched and automatically matches at least one of the characteristics of the identified component with one or more of the vendor components stored in any of the vendor databases such as, for instance, information stored in the data repository 68A.

After the recognition algorithm proceeds, the method 300 determines whether there is a single matching object, based upon a predetermined confidence criteria at a block 310. For instance, the recognition algorithm may assign a relevancy score (e.g., 100%, 75%, 45%, etc.) to the matched comparisons based upon known matching algorithms. In this instance, a configuration setting can allow all relevancy ratings at or above a predetermined confidence rating (e.g., 100%) to be directly displayed to the user at, for example, block 312.

Figure 5:
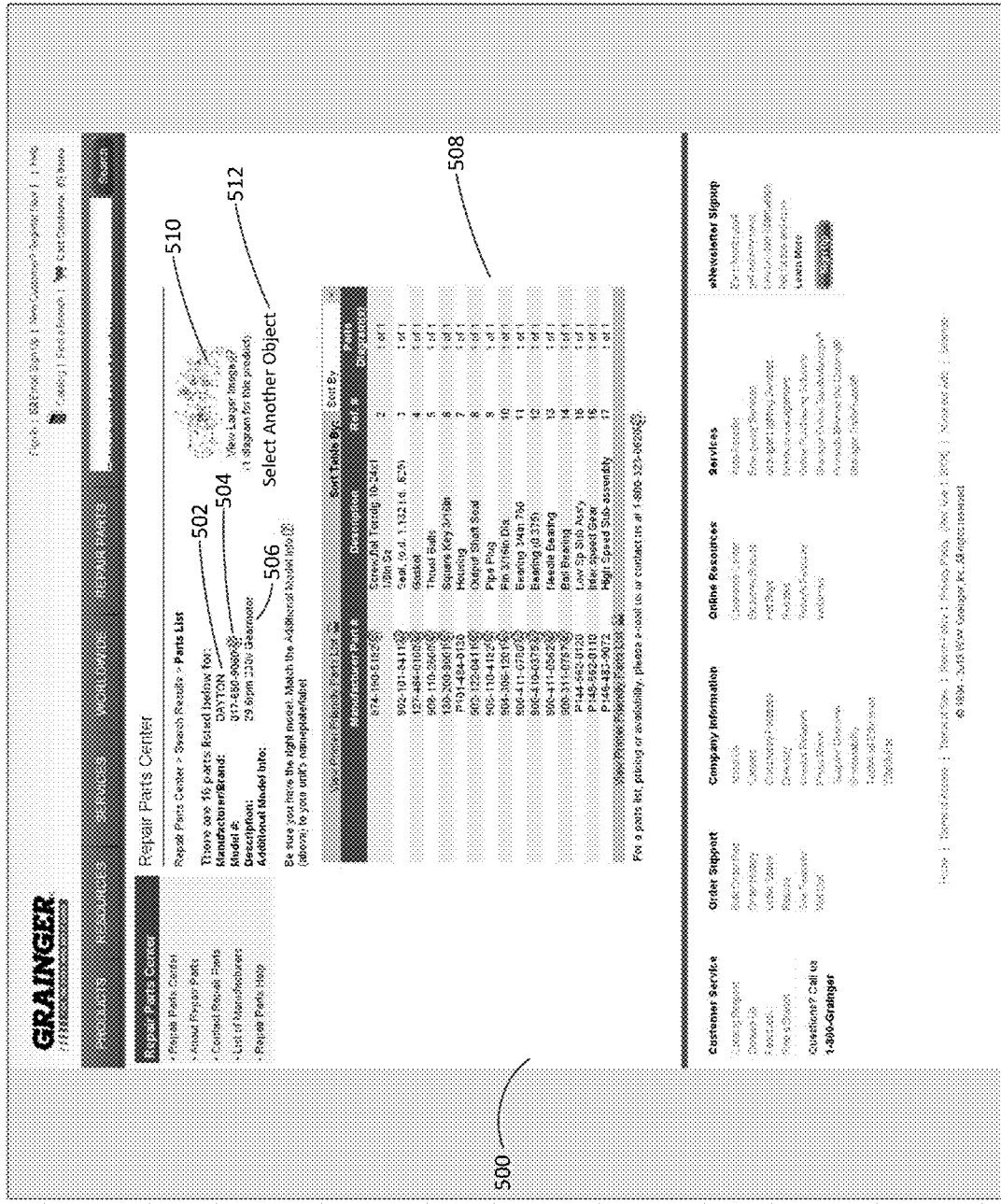
FIG. 5 illustrates an example user interface that provides information regarding an example matched object.
Figure 6:
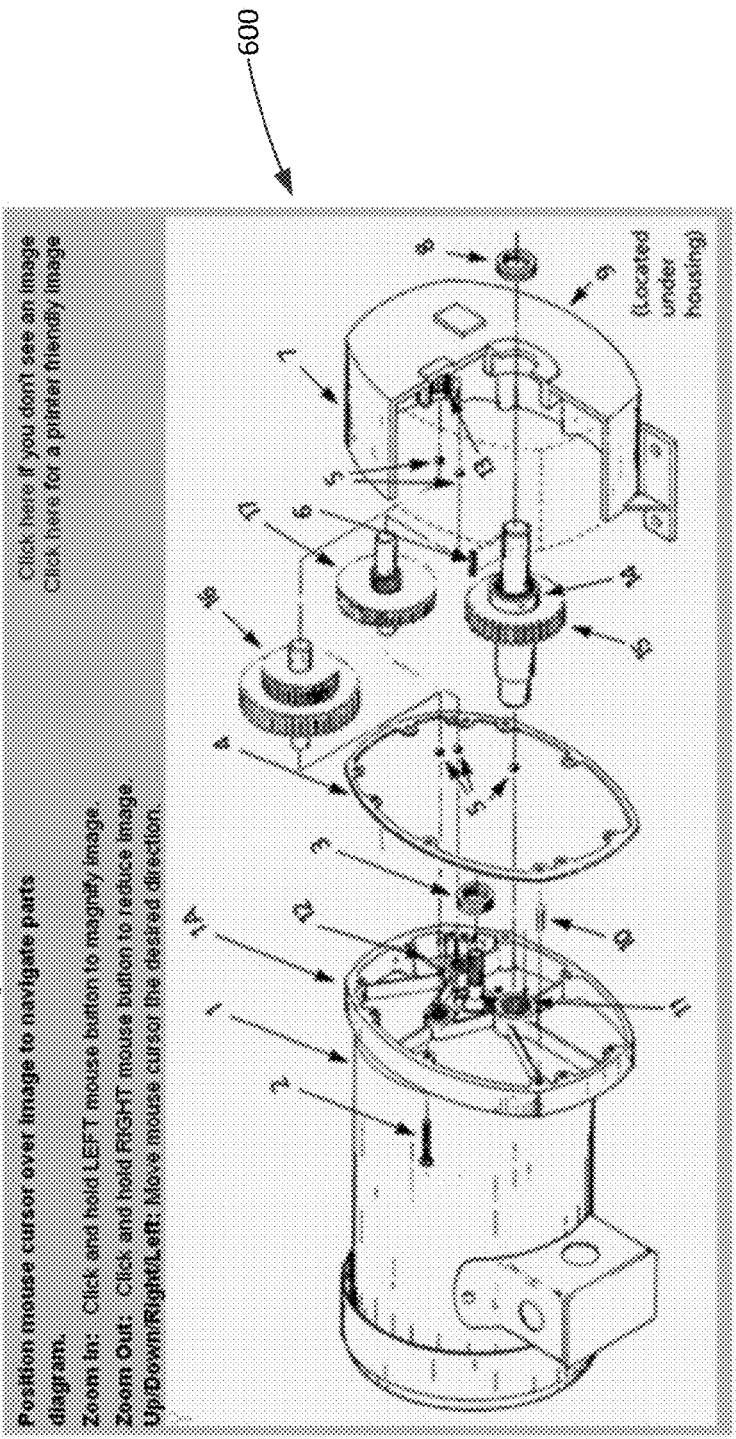
FIG. 6 illustrates an example user interface that provides further information regarding the example matched object.

An example user interface 500 displaying relevant information regarding the components associated with a match of the object 302a with the components in the data repository 69A is displayed in FIG. 5. In the illustrated example, the list 500 includes a manufacturer 502 and model number 504 of the matched object as well as a description 506 and a listing 508 of the individual component parts associated with the matched object. Of course, it will be appreciated that the information displayed and available to the user will vary as desired and as necessary to effect identification of the subject component. Still further, the displayed data may include one of more links to additional information regarding the matched object, displayable through pop-ups, new windows, etc.) For instance, as illustrated, the interface 500 includes a link 510 to display a part assembly diagram, such as for example, a parts diagram 600 illustrated in FIG. 6.

If the process 310, however, determines that there may be multiple possible matches, or alternatively if no match rises to a minimum threshold level to qualify as a match, the method 300 may provide a list of possible matches at a block 314. The listing may include any suitable information to facilitate the identification of the matching object such as a picture, description, etc. as desired. Once the user selects the possible match, process will proceed to block 312 to display the selected part to the user as previously described.

Figure 7:
FIG. 7 illustrates an example user interface that provides detail information regarding an example subcomponent of the example matched object.

Even with the confidence of the automated matching algorithm, and/or the manual selection of the likely matched object, mistakes may occur and the user may be presented with a possible need to select a different object. The method 300 provides this availability at a block 316. In the instance where a different object is desired, the interface 500 may include a link 512, which allows the user to change the selected object. If, however, the displayed product is the correct desired product, the individual part needed (which may, in some example, be highlighted or otherwise identified) may be selected and ordered such as though any suitable ordering process 320. One example interface 700 for displaying part information and for providing ordering information is illustrated in FIG. 7. By drilling down into a specified component(s) of the finished good, the user will have the ability to capture additional information of that part, such as for example, part details, part images, manufacturing information, how-to videos, product reviews, available ecommerce sources to procure from, and in some cases order history dependent on the procurement system integration to the user's purchasing history, etc.

It will be appreciated that in other embodiments, the user may be presented with the capability of a full 360 degree rotation of the scanned object 302a on the device's display screen. In this example, the rendered high definition three-dimensional image may provide for additional matching opportunities against the same online corpus of online databases stored in the data repository 68A to display dynamically linkable parts information of each of the components of the finished goods. The rendering of the image may also allow the user to also manipulate the image by moving its various components apart from one another, similar to a computer aided design application, as if it was virtually being disassembled. As noted, if additional information on a single component is required, the user can simply highlight the component through various "touch" methods and additional information will be displayed of that component, such as depicted in FIG. 7.

In still other examples, such as the case of an overheating part (temperature sensor), broken part, worn part, etc., the user will have the ability to research additional information regarding the part including reviews, longevity predictions, operating parameters, etc., because the recognition algorithm will be associated with and have access to the full data repository 68A. For instance, in the event a recall was identified for that part, the latest information from a variety of sources can be displayed to the user; whether it is directly from the manufacture, distributor/retailer, from social community reviews, or other suitable source.

As yet another feature of the present disclosure, the systems and method described herein may be leveraged by the user and/or an organization for its preventative maintenance capabilities. In particular, in this application, the various objects may be saved into a specified database that would along with the corpus of online data repositories integrate user specific information like repair schedules, lifespan of finished good, lifespan of a component of the finished good (in the case of replacement parts), etc.

Although certain example methods and apparatus have been described herein, the scope of coverage of this patent is not limited thereto. On the contrary, this patent covers all methods, apparatus, and articles of manufacture fairly falling within the scope of the appended claims either literally or under the doctrine of equivalents.

I claim:

1. A system for providing nonintrusive identification and ordering of component parts; comprising:
    a nonintrusive scanning device; and
    an image recognition system communicatively coupled with the nonintrusive scanning device, the image recognition system having a processing device and computer readable media having stored therein instruction which instructions, when executed by the processing device, perform steps comprising:
        receiving from the nonintrusive scanning device an image representative of an internal portion of the assembled object which includes at least a portion of each of a plurality of the component parts that are not visible without opening or destroying the assembled object;
        matching a surface outline of the at least a portion of each of the component parts included in the image representative of the internal portion of the assembled object as received from the nonintrusive scanning device against identifiable characteristics of a plurality of component parts stored in a data repository associated with the image recognition system to identify one or more of the plurality of component parts as being abnormal; and
        causing a user interface to be displayed on a client computing device to permit a user to access an order access point in which the one or more of the plurality of component parts identified as being abnormal can be purchased from the electronic vendor system;
    wherein the nonintrusive scanning device is at least one of an x-ray or a γ-ray device and the one or more of the plurality of component parts identified as being abnormal includes a detected microscopic imperfection.

2. A system for providing nonintrusive identification and ordering of component parts; comprising:
    a nonintrusive scanning device; and
    an image recognition system communicatively coupled with the nonintrusive scanning device, the image recognition system having a processing device and computer readable media having stored therein instruction which instructions, when executed by the processing device, perform steps comprising:
        receiving from the nonintrusive scanning device an image representative of an internal portion of the assembled object which includes at least a portion of each of a plurality of the component parts that are not visible without opening or destroying the assembled object;
        matching a surface outline of the at least a portion of each of the component parts included in the image representative of the internal portion of the assembled object as received from the nonintrusive scanning device against identifiable characteristics of a plurality of component parts stored in a data repository associated with the image recognition system to identify one or more of the plurality of component parts as being abnormal; and
        causing a user interface to be displayed on a client computing device to permit a user to access an order access point in which the one or more of the plurality of component parts identified as being abnormal can be purchased from the electronic vendor system;
    wherein the image representative of the internal portion of the assembled object is a three-dimensional, surface outline image of the internal portion of the assembled object.

3. The system as recited in claim 2, wherein the three-dimensional image is manipulateable to provide additional views of the image.

* * * * *